(12) United States Patent
Yeh

(10) Patent No.: US 9,829,774 B2
(45) Date of Patent: Nov. 28, 2017

(54) ENCLOSURE ASSEMBLY

(71) Applicant: HON HAI PRECISION INDUSTRY CO., LTD., New Taipei (TW)

(72) Inventor: Chin-Wen Yeh, New Taipei (TW)

(73) Assignee: HON HAI PRECISION INDUSTRY CO., LTD., New taipei (TW)

( * ) Notice: Subject to any disclaimer, the term of this patent is extended or adjusted under 35 U.S.C. 154(b) by 539 days.

(21) Appl. No.: 14/576,481

(22) Filed: Dec. 19, 2014

(65) Prior Publication Data

US 2016/0147134 A1 May 26, 2016

(30) Foreign Application Priority Data

Nov. 25, 2014 (CN) .................... 2014 2 0715013 U

(51) Int. Cl.
*G03B 21/16* (2006.01)
*H05K 7/20* (2006.01)
*G03B 21/14* (2006.01)

(52) U.S. Cl.
CPC ........... *G03B 21/16* (2013.01); *G03B 21/145* (2013.01); *H05K 7/20145* (2013.01)

(58) Field of Classification Search
CPC ............................ G03B 21/16; H05K 7/20145
See application file for complete search history.

(56) References Cited

U.S. PATENT DOCUMENTS

| | | | | |
|---|---|---|---|---|
| 6,731,502 B1* | 5/2004 | Hsu | ..................... | H05K 7/20727 165/80.3 |
| 7,408,773 B2* | 8/2008 | Wobig | ..................... | G06F 1/20 165/104.33 |
| 7,586,746 B2* | 9/2009 | Liu | ..................... | H05K 7/20727 165/104.33 |
| 8,238,093 B2* | 8/2012 | Yeh | ..................... | G06F 1/20 165/80.3 |
| 8,605,427 B2* | 12/2013 | Chen | ..................... | H01L 23/467 165/80.3 |
| 8,941,987 B2* | 1/2015 | Makley | ..................... | G06F 1/20 165/104.11 |
| 2013/0052934 A1* | 2/2013 | Tang | ..................... | G06F 1/20 454/284 |
| 2013/0153178 A1* | 6/2013 | Li | ..................... | H01L 23/467 165/104.34 |

* cited by examiner

*Primary Examiner* — Robert J Hoffberg
(74) *Attorney, Agent, or Firm* — Steven Reiss

(57) ABSTRACT

Enclosure assembly includes a clipping member for being secured to an electronic device and an air guiding duct coupled to the clipping member. The clipping member includes a coupling panel. The air guiding duct is used to engage with a fan of the electronic device and includes a securing panel extending from the coupling panel and an air guiding panel extending from the securing panel. The air guiding panel includes a first air guiding portion and a second air guiding portion obliquely extending from the first air guiding portion.

15 Claims, 4 Drawing Sheets

ENCLOSURE ASSEMBLY

FIELD

The subject matter herein relates to an enclosure assembly with an air guiding member duct and a clipping member.

BACKGROUND

An electronic device, such as a projector, typically comprises an air guiding duct and a mounting member separated from the air guiding duct. The air guiding duct can comprise two guiding members separated from one another. During assembly of the air guiding duct and the mounting member to a lampshade of the projector, the two guiding members can be secured to each other to allow the air guiding duct to be secured to the projector, and then the mounting member can be secured to the lampshade of the projector.

BRIEF DESCRIPTION OF THE DRAWINGS

Implementations of the present technology will now be described, by way of example only, with reference to the attached figures.

DETAILED DESCRIPTION

Figure 1:
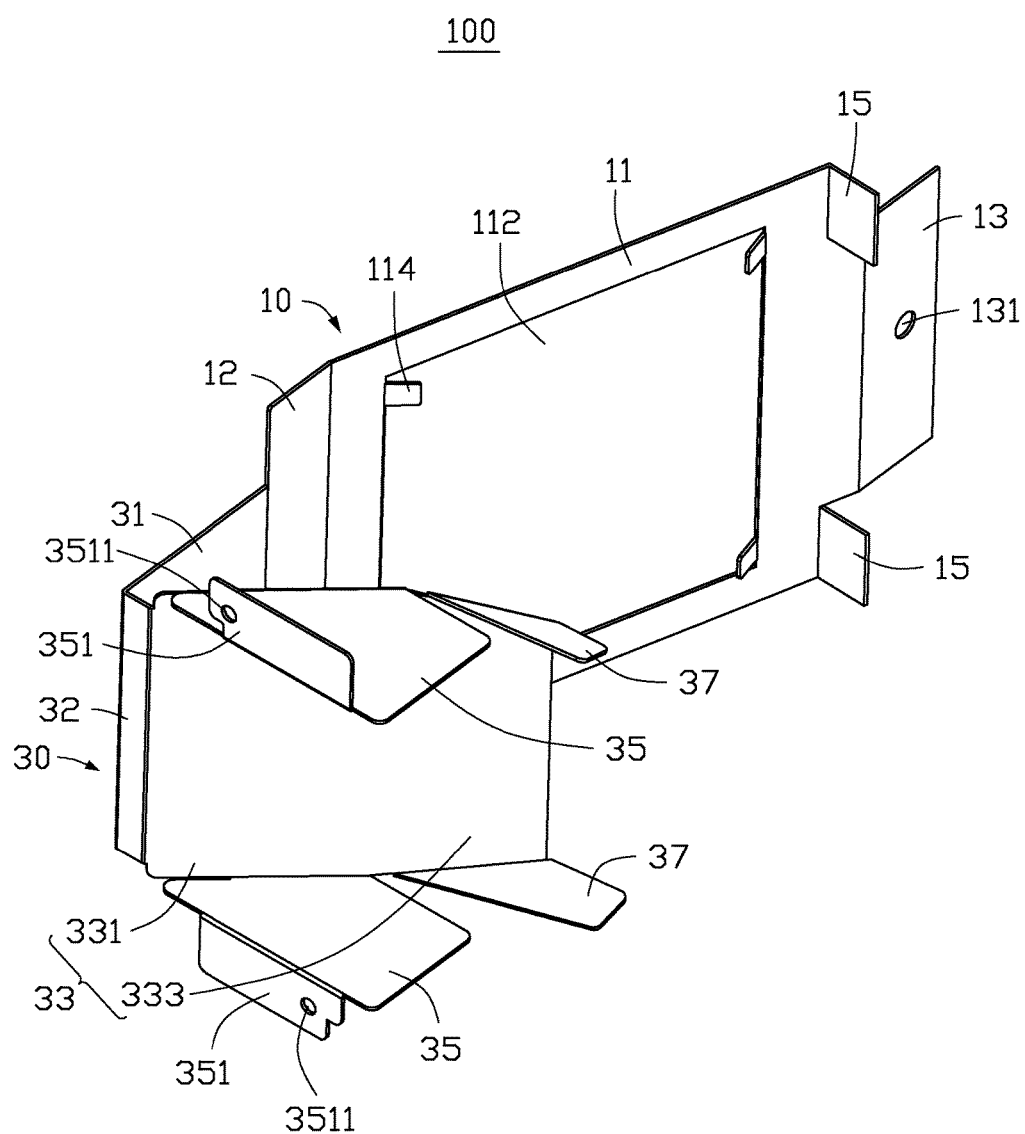
FIG. 1 is an isometric view of an embodiment of an enclosure assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to an enclosure assembly. The enclosure assembly includes a clipping member configured to be secured to an electronic device and an air guiding duct coupled to the clipping member. The clipping member includes a coupling panel. The air guiding duct is configured to engage with a fan of the electronic device and includes a securing panel extending from the coupling panel and an air guiding panel extending from the securing panel. The air guiding panel includes a first air guiding portion and a second air guiding portion obliquely extending from the first air guiding portion.

FIG. 1 illustrates an embodiment of an enclosure assembly 100. The enclosure assembly 100 includes a clipping member 10 and an air guiding duct 30 connected to the clipping member 10. The enclosure assembly 100 can be used in an electronic device 50 (see FIG. 2). In at least one embodiment, the clipping member 10 is integrated with the air guiding duct 30, and the electronic device 50 can be a projector 50.

The clipping member 10 includes a main body 11, a coupling panel 12 connected to a first edge of the main body 11, and a mounting panel 13 connected to a second opposite edge of the main body 11. A through hole 112 is defined in the main body 11, and four elastic pieces 114 extend from edges of the through hole 112. In at least one embodiment, the four elastic pieces 114 are arranged at four corners of the through hole 112. The mounting panel 13 extends from the main body 11 and defines a mounting hole 131. The clipping member 10 can be secured to the electronic device 50 via the mounting panel 13. Two clipping pieces 15, are arranged on opposite sides of the mounting panel 13, extending from the main body 11.

The air guiding duct 30 can include a securing panel 31 coupled to the coupling panel 12, a connecting panel 32 coupled to the securing panel 31, an air guiding panel 33 obliquely extending from the connecting panel 32, two side panels 35 extending from the air guiding panel 33, and two guiding pieces 37 extending from the air guiding panel 33. The securing panel 31 extends from the coupling panel 12 and defines a securing hole 311. The air guiding panel 33 includes a first air guiding portion 331 and a second air guiding portion 333 obliquely extending from the first guiding portion 331. An arcuate angle is defined between the first air guiding portion 331 and the securing panel 31. The two side panels 35 extend from opposite edges of the first air guiding portion 331, and the two guiding pieces 37 extend from opposite edges of the second air guiding portion 333. In at least one embodiment, the two side panels 35 are substantially parallel, and a flange 351 extends from each side panel 35. A positioning hole 3511 can be defined in the flange 351. The air guiding duct 30 can be secured to the electronic device 50 by the securing panel 31 and the flange 35.

Figure 2:
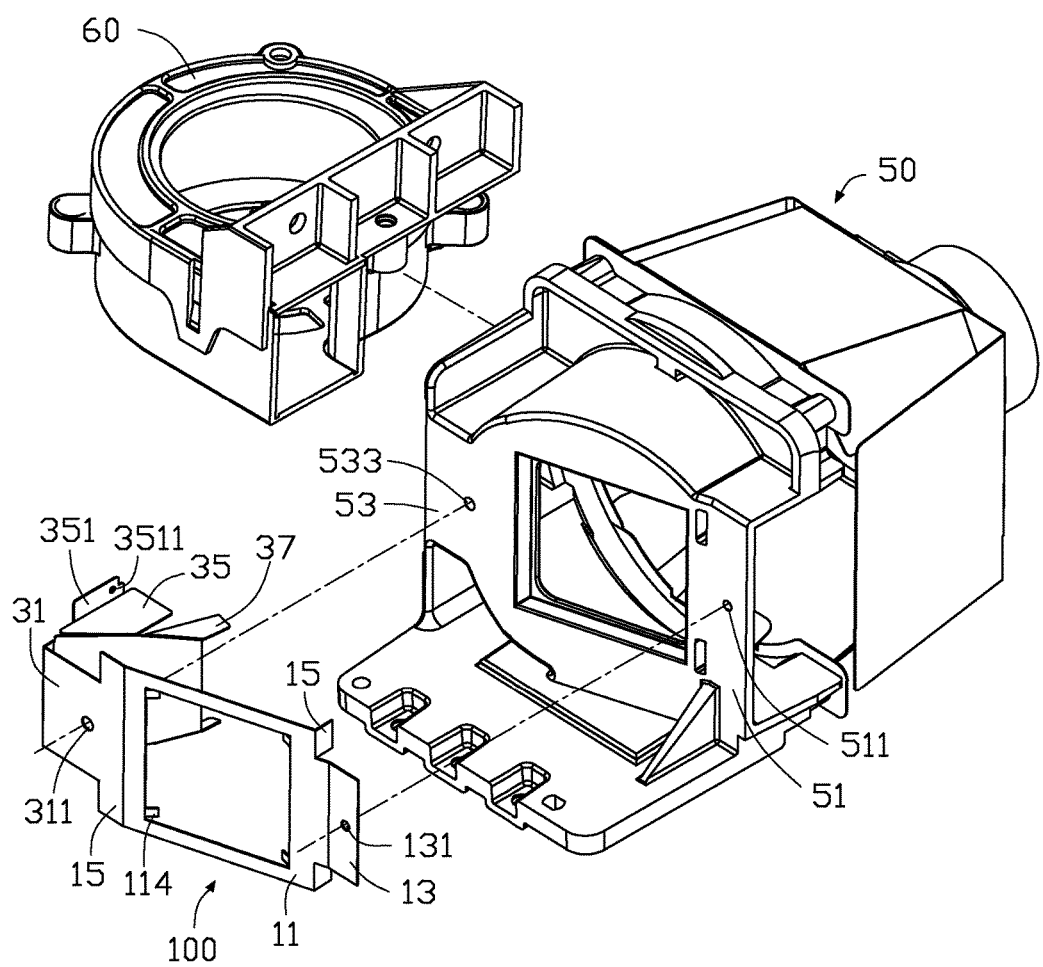
FIG. 2 is an exploded, isometric view of an embodiment of an enclosure assembly and an electronic device.

FIG. 2 illustrates the electronic device 50 which the air guiding duct 100 is secured. The electronic device 50 includes a fixing portion 51 and a fastening portion 53. The fixing portion 51 is configured to secure a light source (not shown) and defines an opening 510 for the light source to be exposed. A first fastening hole 511 is defined in the fixing portion 51 and corresponds to the mounting hole 131, and two clipping holes 513 (only one is shown) are located on the fixing portion 51 corresponding to the two clipping pieces 15. The fastening portion 53 is used to secure a fan 60. The two guiding pieces 37, the two side panels 33 and the air guiding panel 31 can together guide the air flowing into the air guiding duct 30 to the fan 60. A receiving slot 531 is defined in the fastening portion 53. Two second fastening holes (not shown) and a third fastening hole 533 are defined in the fastening portion 53. The second fastening hole corresponds to the positioning holes 3511, and the third fastening hole 533 corresponds to the securing hole 311.

Figure 3:
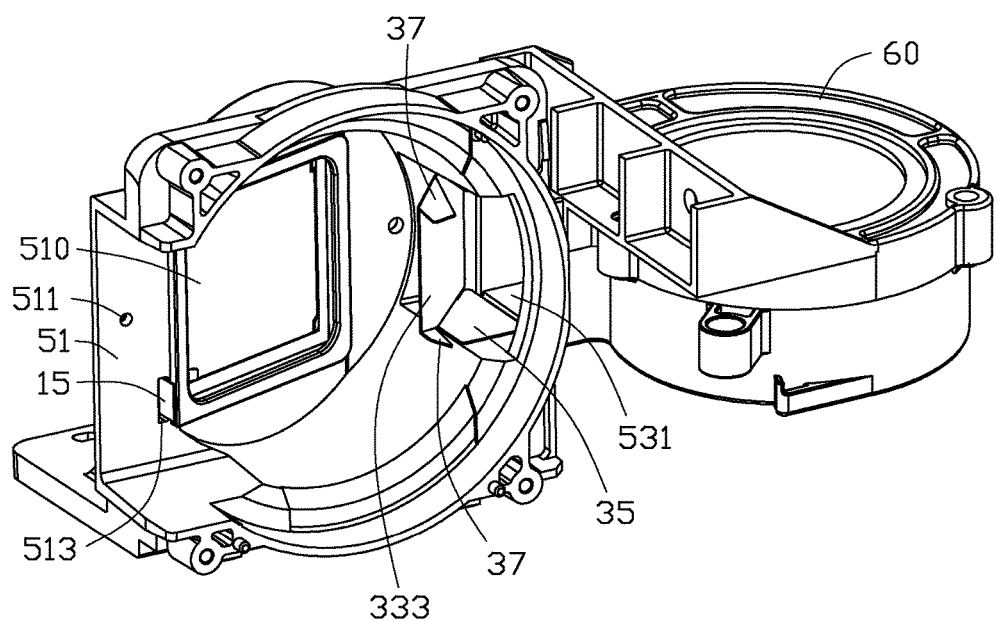
FIG. 3 is a partial, assembled view of the enclosure assembly and the electronic device of FIG. 2.
Figure 4:
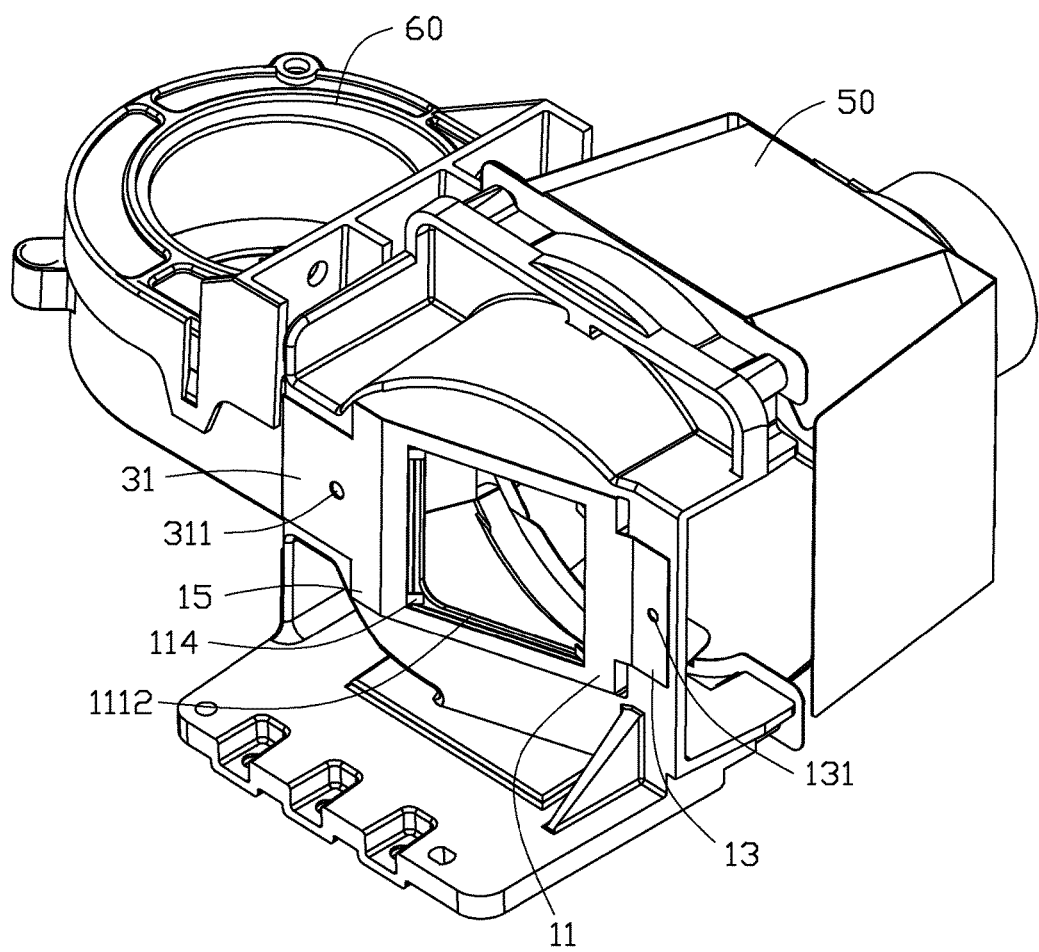
FIG. 4 is an assembled view of the enclosure assembly and the electronic device of FIG. 2.

FIGS. 3-4 illustrate that, in assembly, the clipping member 10 is placed on the fixing portion 51, and the two clipping pieces 15 are engaged in the two clipping holes 513. The mounting hole 131 is aligned with the first fastening hole 511, and a first mounting member (not shown), such as a screw, is engaged in the mounting hole 131 and the first fastening hole 511 to secure the clipping member 10 to the electronic device 50. At this time, the four elastic pieces 114 can elastically abut the light source of the electronic device 50.

The securing panel 31 of the air guiding duct 30 is placed on the fastening portion 53. The air guiding panel 33, the two side panels 35 and the two guiding pieces 37 are received in the receiving slot 531. The two flanges 351 are located outside of the receiving slot 531. The positioning holes 3511 are aligned with the second fastening holes, and two second mounting members (not shown), such as screws, are engaged in the positioning holes 3511 and the second fastening holes to secure the flange 351 to the electronic device 50. The securing hole 311 is aligned with the third fastening hole 533, and a third mounting member (not shown), such as a screw, is engaged in the securing hole 311 and the third fastening hole 533 to secure the securing panel 31 to the electronic device 30. Therefore, the enclosure assembly 100 can be secured to the electronic device 50.

The embodiments shown and described above are only examples. Many details are often found in the art such as the other features of an enclosure assembly. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An enclosure assembly comprising:
   a clipping member configured to be secured to an electronic device, the clipping member comprising a coupling panel; and
   an air guiding duct coupled to the clipping member, the air guiding duct is configured to engage with a fan of the electronic device and comprising a securing panel and an air guiding panel extending from the securing panel, and the air guiding panel comprising:
      a first air guiding portion;
      a second air guiding portion obliquely extending from the first air guiding portion;
      two side panels extending from opposite edges of the first air guiding portion; and
      two guiding pieces extending from opposite edges of the second air guiding portion, and the two guiding pieces are configured to guide an air to flow into the air guiding duct, each of the two guiding pieces is separated from a representative one of the side panels,
   wherein the securing panel extends from the coupling panel.

2. The enclosure assembly of claim 1, wherein the air guiding duct is integrated with the clipping member.

3. The enclosure assembly of claim 1, wherein an arcuate angle is defined between the first air guiding portion and the securing panel.

4. The enclosure assembly of claim 1, wherein the two side panels are substantially parallel to each other.

5. The enclosure assembly of claim 1, wherein a flange extends from each of the side panels and is substantially perpendicular to the respective one of the side panels, and the flange is configured to be secured to the electronic device.

6. The enclosure assembly of claim 1, wherein the two guiding pieces, the two side panels and the air guiding panel together define an air passage for the air flowing into the fan.

7. The enclosure assembly of claim 1, wherein the clipping member comprises a main body, the coupling panel extends from a first edge of the main body, a mounting panel extends from a second opposite edge of the main body, and the mounting panel is configured to be secured to the electronic device.

8. The enclosure assembly of claim 7, wherein the clipping member further comprises two clipping pieces extending from the main body and arranged at opposite sides of the mounting panel, and the two clipping pieces are configured to engage in two clipping holes of the electronic device.

9. An enclosure assembly comprising:
   a clipping member comprising a main body, a coupling panel extending from a first edge of the main body, and a mounting panel configured to be secured to an electronic device and extending from a second opposite edge of the main body; and
   an air guiding duct configured to engage with a fan of the electronic device and comprising a securing panel configured to be secured to the electronic device and an air guiding panel extending from the securing panel, and the air guiding panel comprising:
      a first air guiding portion;
      a second air guiding portion obliquely extending from the first air guiding portion;
      two side panels extending from opposite edges of the first air guiding portion; and
      two guiding pieces extending from opposite edges of the second air guiding portion, and the two guiding pieces are configured to guide an air to flow into the air guiding duct, each of the two guiding pieces is separated from a representative one of the side panels,
   wherein the securing panel extends from the coupling panel.

10. The enclosure assembly of claim 9, wherein the air guiding duct is integrated with the clipping member.

11. The enclosure assembly of claim 9, wherein an arcuate angle is defined between the first air guiding portion and the securing panel.

12. The enclosure assembly of claim 9, wherein the two side panels are substantially parallel to each other.

13. The enclosure assembly of claim 9, wherein a flange extends from each of the side panels and is substantially perpendicular to the respective one of the side panels, and the flange is configured to be secured to the electronic device.

14. The enclosure assembly of claim 9, wherein the two guiding pieces, the two side panels and the air guiding panel together defines an air passage for the air flowing into the fan.

15. The enclosure assembly of claim 9, wherein the clipping member further comprises two clipping pieces extending from the main body and arranged at opposite sides of the mounting panel, and the two clipping pieces are configured to engage in two clipping holes of the electronic device.

* * * * *